(12) United States Patent
Norman

(10) Patent No.: US 6,951,978 B1
(45) Date of Patent: Oct. 4, 2005

(54) CONDUCTIVE FABRIC WITH BALANCED MUTUAL INTERFERENCE AMONGST CONDUCTORS

(75) Inventor: Richard S. Norman, 1877 Poissant Road, Sutton, Quebec (CA) J0E 2K0

(73) Assignee: Richard S. Norman, Sutton (CA)

( * ) Notice: Subject to any disclaimer, the term of this patent is extended or adjusted under 35 U.S.C. 154(b) by 0 days.

(21) Appl. No.: 10/739,047

(22) Filed: Dec. 19, 2003

Related U.S. Application Data

(60) Provisional application No. 60/436,628, filed on Dec. 30, 2002.

(51) Int. Cl.[7] ............................................. H01B 11/00
(52) U.S. Cl. ........................................ 174/27; 174/33
(58) Field of Search ............................ 174/32, 33, 27, 174/261, 117 FF; 333/1, 12

(56) References Cited

U.S. PATENT DOCUMENTS

| | | | | |
|---|---|---|---|---|
| 3,587,169 A | * | 6/1971 | Benke et al. | 29/825 |
| 3,757,028 A | * | 9/1973 | Schlessel | 174/33 |
| 6,211,456 B1 | * | 4/2001 | Seningen et al. | 174/27 |
| 6,300,846 B1 | * | 10/2001 | Brunker | 333/1 |

* cited by examiner

*Primary Examiner*—Chau N. Nguyen

(57) ABSTRACT

A conductive fabric including a plurality of conductive elements defining an alternating sequence of segments and cross-over regions. Within each of the segments, the conductive elements are arranged substantially in parallel; within each of the cross-over regions located between two adjacent segments, the conductive elements are permuted so as to allow the position occupied by at least one of the conductive elements to be different in each of the two adjacent segments. Between a pair of reference segments, each of the conductive elements experience coupling with respect to a subset of said conductive elements other than itself, the coupling experienced by each of the conductive elements being substantially identical.

24 Claims, 2 Drawing Sheets

CONDUCTIVE FABRIC WITH BALANCED MUTUAL INTERFERENCE AMONGST CONDUCTORS

CROSS-REFERENCES TO RELATED APPLICATIONS

This application claims the benefit of U.S. Provisional Patent Application Ser. No. 60/436,628 filed Dec. 30, 2002, hereby incorporated by reference herein.

The present invention is related in subject matter to U.S. Provisional Patent Application Ser. No. 60/343,167, filed on Dec. 31, 2001, hereby incorporated by reference herein.

The present invention is also related in subject matter to U.S. patent application Ser. No. 10/330,230, filed on Dec. 10, 2002, hereby incorporated by reference herein.

FIELD OF THE INVENTION

The present invention pertains to electrical conductors in general and, more specifically, to laying out multiple conductors on a printed circuit board or in an integrated circuit where the conductors are closely spaced to one another.

BACKGROUND OF THE INVENTION

It is frequently the case that plural, closely spaced electrical conductors are used to join various elements of a circuit. For example, it is conventional to utilize a bus to connect multiple processing elements of a circuit board or integrated circuit. The bus may include from a few to hundreds of electrical conductors that carry separate signals or voltage references and which need to be isolated from one another. In an integrated circuit, the bus may take the form of parallel channels etched in a dielectric substrate. Such channels may be referred to as "wires" which are "bundled" to form the bus.

One effect that takes place during analog or digital signal transmission is mutual interference amongst the wires of the bus. That is to say, regardless of the fact that a dielectric material separates the channels from one another, the signal in one wire of the bus will influence the signal in each of its nearest neighbour channels. As for the effect on the second-nearest neighbouring channels, this is considerably less significant (since it generally decreases per the cube of the distance), although it may in some cases be noticeable.

As a result of mutual interference, the signal travelling along a given individual wire of the bus will become corrupted. Such an effect may be even more pronounced due to signal degradation resulting from the distance travelled by the signal from its source, in addition to the mutual interference effect. Of course, a signal that arrives in a state where it is either below the noise floor or corrupted under the strong influence of the signal in a neighbouring channel will cause a degradation in the performance of the circuit as a whole.

It would therefore be desirable to reduce the mutual interference amongst the wires of a bus. Accordingly, it is known in the art to "braid" the wires by twisting the entire bundle such that across the length of the braid, each wire takes on a continually changing radial component. For the case of two wires, this results in the formation of a "twisted pair", which is known to reduce cross-talk. However, although this pattern is simple to achieve in the case of flexible cables by a mere twisting motion, it is extremely prohibitive to attain in the case of printed circuit boards and even more so for an integrated circuit. Specifically, such a design would require individual, isolated, intertwined channels to be defined across the length of a substrate. In fact, it would be impossible to manufacture such a pattern by means of standard lithographic techniques employing layers and vias.

As such, there remains a need in the art to provide a layout which allows a group of electrical conductors to be extended across portions of a circuit board or integrated circuit with reduced mutual interference amongst the conductors.

SUMMARY OF THE INVENTION

The present invention endeavours to satisfy the above mentioned need. It seeks to achieve this by permuting the conductive elements of a conductive fabric at strategic cross-over regions. The permutation pattern is such that all combination pairs of conductive elements in the conductive fabric experience a substantially uniform amount of coupling.

Thus, according to a first broad aspect, the invention seeks to provide a conductive fabric including a plurality of conductive elements defining an alternating sequence of segments and cross-over regions. Within each of the segments, the conductive elements are arranged substantially in parallel; within each of the cross-over regions located between two adjacent segments, the conductive elements are permuted so as to allow the position occupied by at least one of the conductive elements to be different in each of the two adjacent segments. Between a pair of reference segments, each of the conductive elements experience coupling with respect to a subset of said conductive elements other than itself, the coupling experienced by each of the conductive elements being substantially identical.

In a non-limiting example of implementation, the coupling is an electromagnetic coupling, such as an inductive, a capacitive or a conductive coupling, among others. However, other types of coupling, such as a thermal coupling, are contemplated as being equalized by the present invention.

In a specific example of implementation, for each segment between and including the pair of reference segments, the subset of conductive elements other than a particular conductive element includes the portion of each conductive element occupying a position adjacent to that of the particular conductive element within that segment. In other words, the subset of conductive elements includes conductive elements which occupy nearest-neighbor positions within the segments.

In a further specific and non-limiting example of implementation, the conductive fabric is such that the couplings experienced between each one of the conductive elements within the subset of conductive elements and every other conductive element within that subset are substantially identical, which will be referred to herein below as a "balanced end-to-end coupling". This balanced end-to-end coupling may be achieved through a non-uniformity in lengths and widths of the conductive elements as well as through a non-uniformity in separations between the conductive elements. Alternatively, this balanced end-to-end coupling may be achieved by inserting between the conductive elements a material having a non-uniform dielectric constant, magnetic susceptibility or conductivity.

In a specific embodiment, balanced end-to-end coupling can be achieved by having conductive elements that are substantially evenly spaced apart within each segment. In this alternative, taking N as the number of conductive elements, the balanced end-to-end coupling may be achieved through using the relationship: $M=(P*K)$ modulo (N+1), where a different integer K selected between 1 and N is assigned to each segment, a different integer P selected between 1 and the number of positions is assigned to each position, a different integer M selected between 1 and N is assigned to each conductive element within the subset of said conductive elements, and wherein the conductive element M occupying the Pth position in the segment assigned to a particular integer K.

In a further specific and non-limiting example of implementation, second-nearest-neighbor interactions are also considered in balancing the end-to-end coupling.

In another broad aspect, the invention relates to a method for transmitting a plurality of signals in a conductive fabric including a plurality of conductive elements, wherein the couplings experienced between each conductive element and every other conductive element are substantially identical.

These and other aspects and features of the present invention will now become apparent to those of ordinary skill in the art upon review of the following description of specific embodiments of the invention in conjunction with the accompanying drawings.

DETAILED DESCRIPTION OF THE PREFERRED EMBODIMENTS

Figure 1:
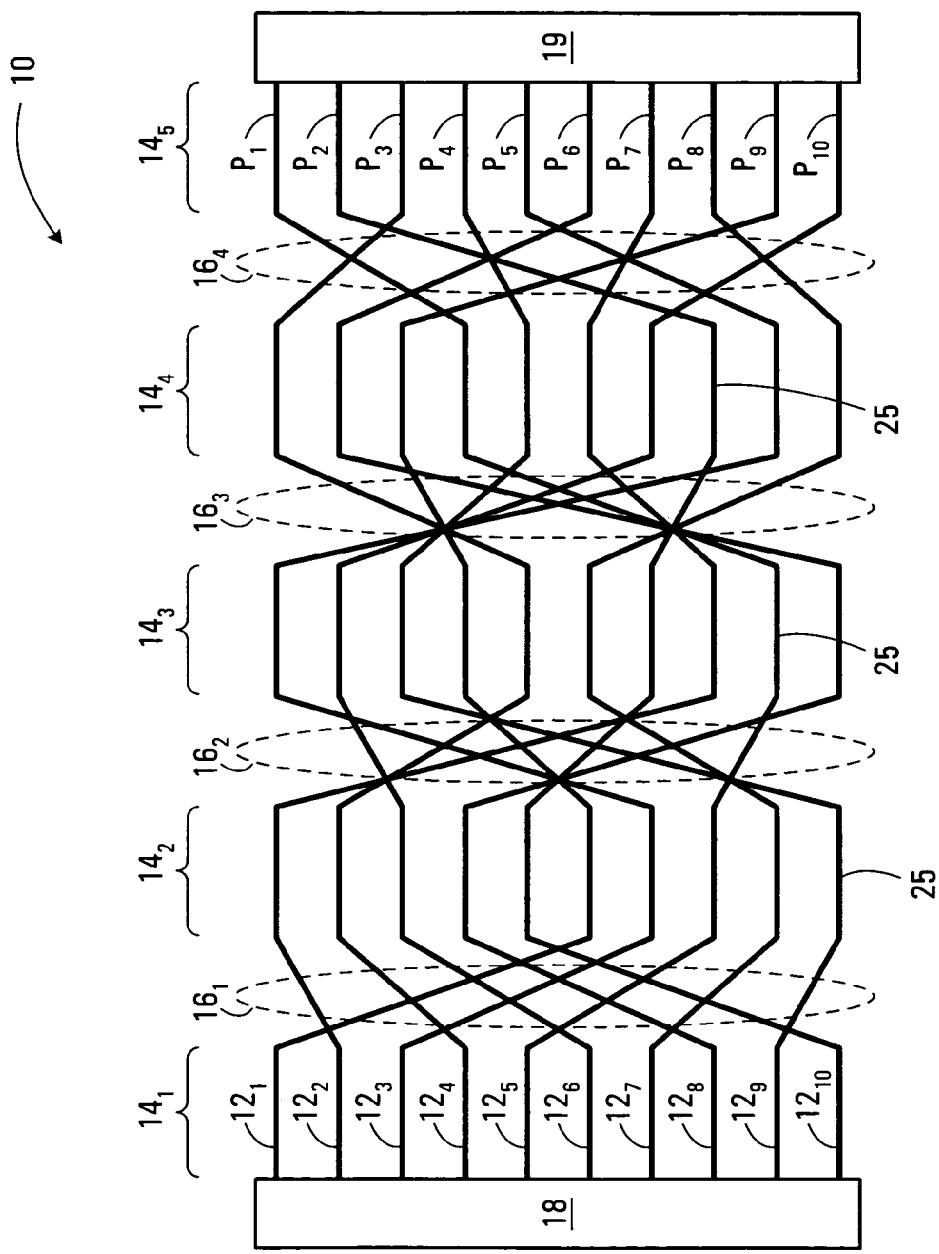
FIG. 1 illustrates a conductive fabric in accordance with an embodiment of the present invention.

With reference to FIG. 1, there is shown a conductive fabric 10 in accordance with an embodiment of the present invention. The conductive fabric 10 includes a plurality of conductive elements $12_1$–$12_N$ which are arranged in an alternating sequence of segments. $14_1$–$14_K$ and cross-over regions $16_1$–$16_Q$. FIG. 1 illustrates a conductive fabric including N=10 conductive elements, K=5 segments and Q=4 cross-over regions. The conductive elements $12_1$–$12_N$ may be made of any suitable material, such as copper or aluminum. The conductive elements $12_1$–$12_N$ may consist of a combination of signal-carrying conductive elements as well as conductive elements that are kept at a reference potential. The signal-carrying conductive elements $12_1$–$12_N$ may carry analog or digital signals in either or both directions of communication across the conductive fabric 10. While not essential, in a specific example of implementation, a first processing element 18 is connected to a first end of the conductive fabric 10 and a second processing element 19 is connected to a second end of the conductive fabric 10. The conductive fabric 10 may thus be viewed as a bus that transports information between processing elements 18 and 19.

Within each segment $14_1$–$14_K$, the conductive elements $12_1$–$12_N$ generally run alongside one another, in parallel. In one embodiment, the conductive elements $12_1$–$12_N$ may be implemented by lithographing conductive tracks onto a dielectric substrate. In other embodiments, elongate wells may be etched into a dielectric substrate, which are then filled with conductive material. It should be noted that there is no requirement that the conductive elements $12_1$–$12_N$ follow a straight line, although it may be advantageous to do so in some circumstances.

Those skilled in the art will observe that a number of positions $P_m$, $1 \leq m \leq M$, may be defined within each segment $14_1$–$14_K$. Specifically, if there are N conductive elements $12_1$–$12_N$, then there are at least N possible positions $P_m$, $1 \leq m \leq N \leq M$, which these N conductive elements $12_1$–$12_N$ may occupy for any given segment. For purposes of illustration, it is assumed that the number M of positions is indeed N, although it may exceed the number N of conductive elements $12_1$–$12_N$. The positions $P_m$ occupied by different conductive elements $12_1$–$12_N$ typically vary from one segment to the next, although it is possible that some (though not all) conductive elements will occupy the same position in two adjacent segments. As will be described in greater detail later on, it is within the cross-over regions $16_1$–$16_Q$ that the conductive elements $12_1$–$12_N$ are permuted so that they may occupy different positions $P_m$ in adjacent segments.

While the embodiment illustrated on FIG. 1 shows a conductive fabric 10 including N=10 conductive elements $12_1$–$12_{10}$, K=5 segments $14_1$–$14_5$ and Q=4 cross-over regions $16_1$–$16_4$, the reader skilled in the art will readily appreciate that many other values of N, K and Q are within the scope of the invention as defined in the appended claims.

In order to permit a fuller understanding of the present invention, it is of benefit to introduce the concept of a "reference direction" along the conductive fabric 10. To this end, and for purposes of illustration, the segment at one end, say the first end of the conductive fabric 10 is referred to as an "initial" segment (segment $14_1$ in this example) and the segment at the second end of the conductive fabric 10 is referred to as a "final" segment (segment $14_1$ in this example). Thus, two reference directions may be established, regardless of the directions(s) in which signals are transmitted along the conductive fabric 10. For purposes of illustration, the direction that extends from the initial segment $14_1$ to the final segment $14_5$ may be termed a "forward" reference direction while the opposite direction may be termed a "reverse" reference direction. One should however keep in mind that the reference to a forward and to a backward reference direction does not necessarily require that signals be propagated in a particular direction through the conductive fabric.

Thus, it should be appreciated that each cross-over region $16_1$–$16_Q$ provides a permutation of the conductive elements $12_1$–$12_N$ in the forward reference direction (a "forward permutation") and another permutation of the conductive elements $12_1$–$12_N$ in the reverse reference direction (a "reverse permutation"). It should also be appreciated that the forward and reverse permutations are inverses of one another. Hence, it is possible to completely describe both the forward and reverse permutations by considering only the forward permutations, as is done in the following in which the forward permutations will be simply referred to as "permutations".

In order to implement a cross-over region, standard lithographic techniques may be used. For instance, for each crossing over of conductive elements $12_1$–$12_N$, it is within the scope to implement a conductive via in a dielectric substrate. This and other techniques for allowing conductive elements to cross over one another in distinct regions will be known to those of ordinary skill in the art.

The permutations and the segments $14_1, \ldots, 14_K$ are designed to possess a special property which renders the resulting conductive fabric 10 particularly amenable to implementation on a circuit board or in an integrated circuit. Specifically, the permutations and the specific implementation of the conductive elements 12 within each segment are selected such that each conductive element $12_j$, $1 \leq j \leq N$, experiences with respect to every other conductive element $12_1, \ldots, 12_{j-1}, 12_{j+1}, \ldots, 12_N$ an amount of end-to-end coupling that is substantially uniform. This property will be referred to as a "balanced end-to-end coupling".

For the purpose of this description, "coupling" is meant to encompass an interaction through physical processes which tends to produce interference in a signal propagated in the particular conductive element $12_j$ when a signal is propagated in at least one of the other conductive elements $12_1, \ldots, 12_{j-1}, 12_{j+1}, \ldots, 12_N$. Accordingly, due to the fact that balanced end-to-end coupling is achieved, each conductive element will tend to experience the same amount of interference caused by signals propagating in the other conductive elements. Thus, the effect on the integrity of signals propagating between the processing elements 18 and 19 will be substantially identical amongst the various conductive elements $12_1$–$12_N$. This is to be contrasted to a traditional bus wherein wires run parallel to each other between two entities of interest and wherein a particular wire experiences interference mainly from those wires which are closest to the particular wire, resulting in an unbalanced effect on signal integrity.

In a specific and non-limiting example of implementation, the coupling to be balanced is electromagnetic in nature. Thus, in a specific implementation, the permutations and the specific implementation of the conductive elements 12 are selected such that each conductive element $12_j$ experiences with respect to every other conductive element $12_1, \ldots, 12_{j-1}, 12_{j+1}, \ldots, 12_N$ an amount of electromagnetic coupling that is substantially uniform. Examples of electromagnetic coupling include, but are not limited to, inductive coupling, capacitive coupling and resistive coupling. In another non-limiting example of implementation, the coupling to be balanced is of the thermal variety.

Moreover, in any given segment $14_1$–$14_K$, it is observed that each conductive element has exactly one or two nearest neighbours. In a specific example of implementation, the electromagnetic coupling that is rendered uniform on an end-to-end basis includes a component arising from electromagnetic interaction between the conductive elements 12 and their one or two nearest-neighbors, so-called nearest-neighbor interaction. Specifically, it is a property of the permutations of this embodiment of the present invention that each of the conductive element $12_1$–$12_N$ spends the same number of segments $14_1$–$14_K$ as nearest neighbour to each of the other conductive elements $12_1$–$12_N$ within the conductive fabric 10 and that within each segment $14_1$–$14_K$, the electromagnetic coupling be identical between each conductive element and each of its nearest neighbors. In other words, the number of segments $14_1$–$14_K$ for which each conductive element $12_j$ is the nearest neighbour of each other conductive element $12_1$–$12_{j-1}$, $14_{j+1}$–$12_N$ is the same and each of these nearest-neighbours is identically coupled with that conductive element.

In a specific example of implementation, the conductive elements $12_1$–$12_N$ take the form of identical equally spaced straight and parallel coplanar conductors within all the segments $14_1$–$14_K$. In other examples of implementation, a length and a width of each of the conductive elements 12 as well as the spacing therebetween are adjusted within each of the segments $14_1$–$14_K$ such that the couplings between neatest-neighbors are identical in all the segments $14_1$–$14_K$. Specifically, in the case wherein the coupling is electromagnetic coupling, increasing the length of two conductive elements within a particular segment, widening a particular conductive element and decreasing the spacing between two conductive elements within a particular segment all increase the electromagnetic coupling between the conductive elements in question.

In certain cases, for each N, and in particular where N+1 is a prime number, it is possible to achieve the above-described balancing of coupling using as few as Q=N/2−1 cross-over portions $16_1$–$16_Q$. In a specific and non-limiting example of implementation, the following equation indicates which conductive element ($12_n$) should occupy the $m^{th}$ position $P_m$ in the $k^{th}$ segment $14_k$, the segments $14_1$–$14_K$ being counted from the segment $14_1$ at the first end toward the segment $14_K$ at the second end. Alternatively, the equation indicates which position ($P_m$) should be occupied by the $n^{th}$ conductive element $12_n$ in the $k_{th}$ segment $14_k$ or, still alternatively, identifies the segment ($14_k$) in which the $n^{th}$ conductive element $12_n$ should occupy the $m^{th}$ position $P_m$:

$$n = (m * k) \bmod (N+1) \qquad (\text{eq 1})$$

wherein "A modulo B" represents the remainder of the integer division of A by B. The reader skilled in the art will readily appreciate that this equation is merely representative of one way to implement an arrangement such that each conductive element has as a nearest-neighbor every other conductive element 14 once within the conductive fabric 10.

Furthermore, starting with a specific conductive fabric 10 in which the positions of the conductive elements within the segments is governed by equation (eq 1), the reader skilled in the art will appreciate that other conductive fabrics 10 having the desired coupling properties can be obtained by permuting the order of the segments of the specific conductive fabric 10. In addition, other conductive fabrics 10 having the desired electromagnetic coupling properties can be obtained by reversing the order of the conductive elements 12 within any one or more segments 14. These two manners of obtaining alternative suitable conductive fabrics 10 preserve the balancing of end-to-end coupling because a permutation of the segments 14 or a reversal in the order of the conductive elements 12 within a segment 14 does not affect nearest-neighboring relationships. However, it may be advantageous from the standpoint of lithography to choose one equivalent implementation over another.

In the case wherein the number N of conductive elements 12 is an odd number, it is possible to achieve the above-described balancing of coupling using at least Q=N−1 cross-over portions 16. Specific examples of positions occupied by each conductive element 12 within each segment 14 are shown below for N=3, 5 and 7 in matrix form, wherein the elements of the matrices identify the conductive elements 12, column x correspond to segment $14_x$ and row y corresponds to position $P_y$. The geometric disposition of the numbers identifying the conductive elements 12 is therefore in accordance with the graphical representation of the conductive matrix 10 represented on FIG. 1.

For N=3, an example of conductive fabric 10 is:

| $12_1$ | $12_2$ | $12_3$ |
|---|---|---|
| $12_2$ | $12_3$ | $12_1$ |
| $12_3$ | $12_1$ | $12_2$ |

For N=5, an example of conductive fabric 10 is:

| | | | | |
|---|---|---|---|---|
| $12_1$ | $12_2$ | $12_3$ | $12_4$ | $12_5$ |
| $12_4$ | $12_5$ | $12_1$ | $12_2$ | $12_3$ |
| $12_5$ | $12_1$ | $12_2$ | $12_3$ | $12_4$ |
| $12_3$ | $12_4$ | $12_5$ | $12_1$ | $12_2$ |
| $12_2$ | $12_3$ | $12_4$ | $12_5$ | $12_1$ |

For N=7, an example of conductive fabric 10 is:

| | | | | | | |
|---|---|---|---|---|---|---|
| $12_1$ | $12_2$ | $12_3$ | $12_4$ | $12_5$ | $12_6$ | $12_7$ |
| $12_2$ | $12_3$ | $12_4$ | $12_5$ | $12_6$ | $12_7$ | $12_1$ |
| $12_4$ | $12_5$ | $12_6$ | $12_7$ | $12_1$ | $12_2$ | $12_3$ |
| $12_7$ | $12_1$ | $12_2$ | $12_3$ | $12_4$ | $12_5$ | $12_6$ |
| $12_3$ | $12_4$ | $12_5$ | $12_6$ | $12_7$ | $12_1$ | $12_2$ |
| $12_5$ | $12_6$ | $12_7$ | $12_1$ | $12_2$ | $12_3$ | $12_4$ |
| $12_6$ | $12_7$ | $12_1$ | $12_2$ | $12_3$ | $12_4$ | $12_5$ |

The reader skilled in the art will also readily appreciate that any permutation of segments 14 of the conductive fabric 10 presented for N=3, 5 and 7 also produces a conductive fabric 10 presenting a balanced end-to-end coupling for the same reasons as those mentioned herein above with respect to an even number N of conductive elements 12.

The reader skilled in the art will appreciate that adding a supplemental conductive element to an odd number N of conductive elements produces a total number N+1 of conductive elements, which is an even number. Accordingly, it may be advantageous in some circumstances to add such a supplemental conductive element to an odd number N of conductive elements, even if the supplemental conductive element does not carry any signal, and to use the permutations applicable to a conductive fabric 10 having an even number of conductive elements, such as the ones described previously for example.

Various modifications of the present invention are possible. In some cases, signal degradation may be more severe (in terms of percentage loss) immediately following transmission of the signal rather than at later stages of travel. Therefore, even if each combination of conductive elements spends the same number of segments as nearest neighbours, the distance spent as nearest neighbours closer to one end of the conductive fabric 10 may be more significant than the distance spent as nearest neighbours closer to another end of the conductive fabric 10. To compensate for this effect, it is within the scope of the present invention to elongate the segments 14 closer to an end of the conductive fabric where signals originate. In fact, it is within the scope of the present invention to tailor the length of each segment or of each conductive element within the segments in any suitable way producing a balanced end-to-end coupling.

While the above description has focused primarily on nearest neighbours, it should be understood that in some cases, it may be desirable to mitigate the effect of second-nearest-neighbour interference. Therefore, the permutations imparted by the cross-over region located between each pair of adjacent segments may be configured so as to cause each pair of conductive elements occupying second-nearest-neighbouring positions within one segment of that pair of adjacent segments to occupy non-second-nearest-neighbouring positions within the other segment of that pair of adjacent segments.

The reader skilled in the art will appreciate that it is possible to produce conductive fabrics 10 wherein the total nearest and second-nearest neighbor interactions are substantially identical by adjusting the conductive elements within segments 14 such that nearest-neighbor coupling compensate for extra or missing second-neighbor coupling. To that effect one can, for example, vary the length of the conductive elements, the spacing between conductive elements or the width of the conductive elements, with the corresponding effect on electromagnetic coupling having been described herein above. In addition, dielectric, conductive and magnetic properties of a substrate between the conductive elements can also be varied to achieve the same result using methods that are well known in the art.

Figure 2:
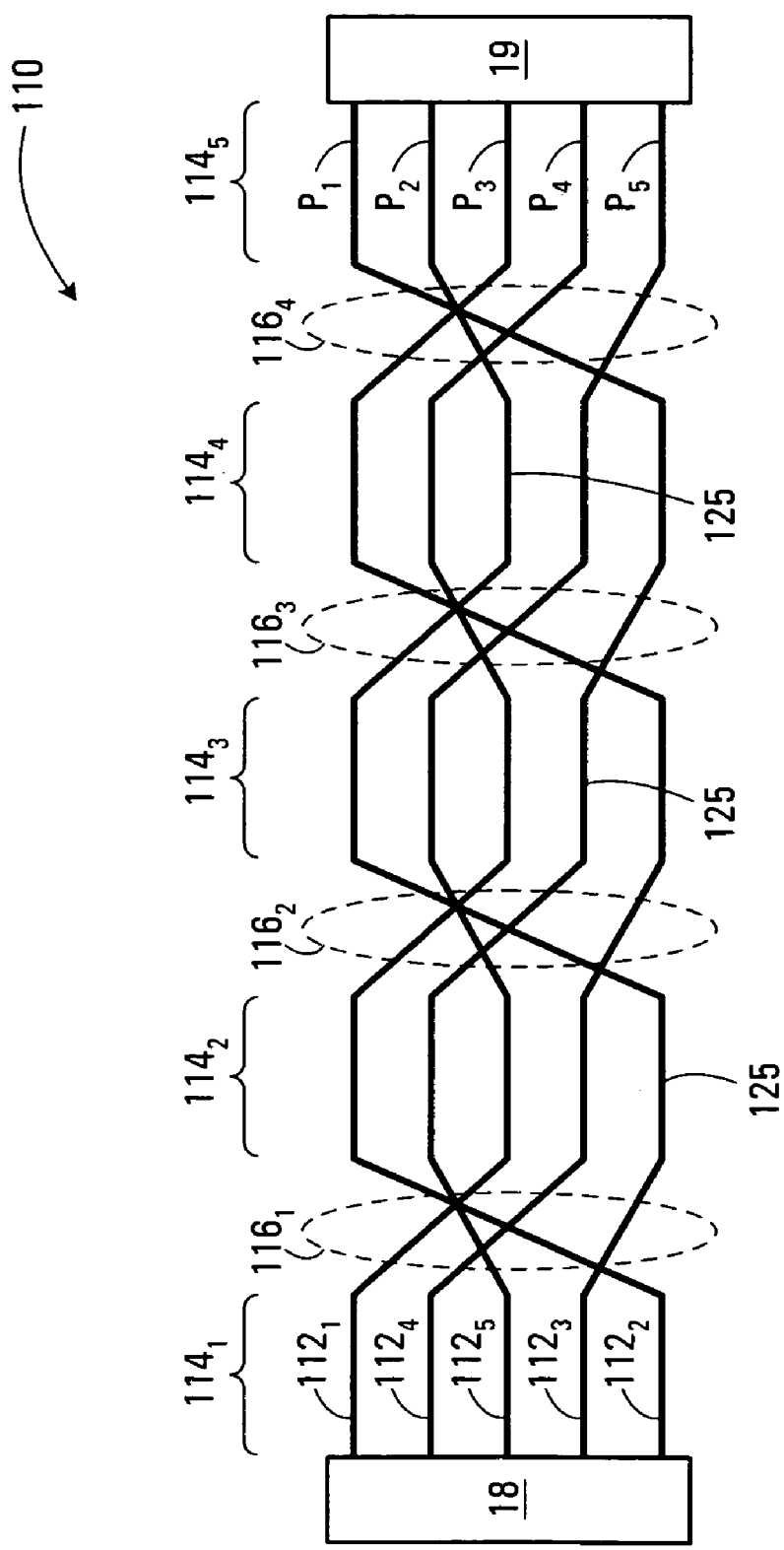
FIG. 2 illustrates a conductive fabric in accordance with an alternative embodiment of the present invention.

The following example serves to illustrate this point. One may consider, by way of example, the conductive fabric 110 for N=5 described previously, which is illustrated in FIG. 2. The conductive fabric 110 includes ~5 conductive elements $112_1$–$112_5$ which are arranged in an alternating sequence of segments $114_1$–$114_5$ and cross-over regions $116_1$–$116_4$. One can readily appreciate that each conductive element $112_i$ within that particular conductive fabric 110 has every other conductive element $112_j$, j≠i as a nearest-neighbor exactly 2 times. However, each conductive element $112_i$ does not have each other conductive element $112_j$ as a second nearest-neighbor an equal amount of times. For example, the conductive element $112_1$ has the conductive element $112_5$ as a second neighbor twice (in segments $114_1$ and $114_3$), while it has the conductive element $112_3$ as a second nearest-neighbor only once (in segment $114_2$).

To compensate for a reduced electromagnetic coupling between the conductive element $112_1$ and the conductive element $112_3$ with respect to the electromagnetic coupling between the conductive element $112_1$ and the conductive element $112_5$ caused by the absence of one second nearest-neighbor coupling, the electromagnetic coupling between the conductive element $112_1$ and the conductive element $112_3$ can be increased when these two last conductive elements are in nearest-neighbor positions. For example, this can be performed by suitably widening the conductive element in the third position of the fourth segment $114_4$ (which is occupied by the conductive element $112_3$) in the direction of the fourth position of the same segment $114_4$ (which is occupied by the conductive element $112_1$). This will result in an increase in the electromagnetic coupling between the conductive element $112_1$, and the conductive element $112_3$. This example is given for illustrative purposes only and the reader skilled in the art will recognise that the balancing of end-to-end couplings can be performed in many other ways, including decreasing nearest-neighbor couplings for a nearest-neighbor coupling to compensate for extra second nearest-neighbor couplings.

It should be understood that although the present invention has been described in terms of conductive elements 12 which take, within segments 14, the form of series of conductive elements that are viewed as travelling in the same plane alongside one another, the present invention is nonetheless applicable to a three-dimensional fabric of conductive elements 12. For example, the conductive elements within a segment $14_k$ may alternate between two or more planes.

In addition, it may be advantageous in some cases to balance only partially a coupling between a number of conductive elements 12, for example when the number of conductive elements 12 is large. To that effect, the conductive elements might be divided into groups, each group being implemented into a conductive fabric such as the ones described herein above. For example, if 64 conductive elements connect two processing elements, one may divide the conductive elements into 8 groups of 8 conductive elements which occupy adjacent positions in a segment located closest to one processing element. Then, each group of 8 conductive elements can be embodied in a conductive fabric which balances coupling within the group of 8 conductive elements as described herein above.

While specific embodiments of the present invention have been described and illustrated, it will be apparent to those skilled in the art that numerous modifications and variations can be made without departing from the scope of the invention as defined in the appended claims.

What is claimed is:

1. A conductive fabric, comprising:
   a) a plurality of conductive elements defining an alternating sequence of segments and cross-over regions, the segments including a pair of reference segments;
   b) within each of said segments, said conductive elements being arranged substantially in parallel;
   c) within each of said cross-over regions located between two adjacent segments, said conductive elements being permuted so as to allow the position occupied by at least one of said conductive elements to be different in each of the two adjacent segments;
   d) between the pair of reference segments, each of said conductive elements experiencing coupling with respect to at least one of said conductive elements other than itself; and
   e) the coupling experienced by each of said conductive elements being substantially identical;
   wherein, for a particular one of the conductive elements, the subset of said conductive elements other than the particular one of the conductive elements includes, for each segment between and including the pair of reference segments, the portion of each conductive element occupying a position adjacent to that of the particular one of said conductive elements.

2. A conductive fabric as defined in claim 1, wherein the coupling is electromagnetic coupling.

3. A conductive fabric as defined in claim 2, wherein the coupling experienced between each one of said conductive elements within the subset of said conductive elements and every other conductive element within the subset of said conductive elements is substantially identical.

4. A conductive fabric as defined in claim 2, wherein the electromagnetic coupling includes capacitive coupling.

5. A conductive fabric as defined in claim 2, wherein the electromagnetic coupling includes inductive coupling.

6. A conductive fabric as defined in claim 2, wherein the electromagnetic coupling includes resistive coupling.

7. A conductive fabric as defined in claim 1, wherein each of said conductive elements has a respective length; and wherein the length of said conductive elements being selected so as to balance the coupling experienced between each one of said conductive elements within the subset of said conductive elements and every other conductive element within the subset of said conductive elements.

8. A conductive fabric as defined in claim 1, wherein each of said conductive elements has a respective cross-section; and wherein the cross-section of said conductive elements being selected so as to balance the coupling experienced between each one of said conductive elements within the subset of said conductive elements and every other conductive element within the subset of said conductive elements.

9. A conductive fabric as defined in claim 1, wherein each pair of adjacent conductive elements is separated by a respective distance; and wherein the distances are selected so as to balance the coupling experienced between each one of said conductive elements within the subset of said conductive elements and every other conductive element within the subset of said conductive elements.

10. A conductive fabric as defined in claim 1, wherein each pair of adjacent conductive elements is separated by a respective material having a dielectric constant; and wherein the dielectric constants are selected so as to balance the coupling experienced between each one of said conductive elements within the subset of said conductive elements and every other conductive element within the subset of said conductive elements.

11. A conductive fabric as defined in claim 1, wherein each pair of adjacent conductive elements is separated by a respective material having a magnetic susceptibility; and wherein the magnetic susceptibilities is selected to as to balance the coupling experienced between each one of said conductive element within the subset of said conductive elements and every other conductive element within the subset of said conductive elements.

12. A conductive fabric as defined in claim 1, wherein each pair of adjacent conductive elements is separated by a respective material having a conductivity; and wherein the conductivities are selected so as to balance the couplings experienced between each one of said conductive element within the subset of said conductive elements and every other conductive element within the subset of said conductive elements are substantially identical at least in part due to a non-uniformity in the conductivity of said respective materials.

13. A conductive fabric as defined in claim 1, wherein, within each of said segments, said conductive elements are substantially evenly spaced apart from one another.

14. A conductive fabric as defined in claim 13, wherein each of said conductive elements has a respective cross-section, the widths of all the conductive elements within any one of said segments being substantially uniform.

15. A conductive fabric as defined in claim 14, wherein said conductive elements take the form of substantially straight conductors within each of said segments.

16. A conductive fabric as defined in claim 1, wherein each of said conductive elements within the subset of said conductive elements occupies a position adjacent to each other of said conductive element within the subset of said conductive elements in an identical number of said segments.

17. A conductive fabric as defined in claim 16, wherein the conductive element occupying the $((m*k)$ modulo $(N+1))^{th}$ position within the $1^{st}$ segment is the same as the conductive element occupying the $p^{th}$ position within the $k^{th}$ segment, where N is the number of conductive elements.

18. A conductive fabric as defined in claim 1, wherein there are fewer cross-over regions than conductive elements within the subset of said conductive elements.

19. A conductive fabric as defined in claim 1, wherein there is one less cross-over region than the number of conductive elements within the subset of said conductive elements.

20. A conductive fabric as defined in claim 1, wherein there is one less than half as many cross-over regions as conductive elements within the subset of said conductive elements.

21. A conductive fabric as defined in claim 1 wherein said conductive elements are substantially coplanar within each of said segments.

22. A conductive fabric as defined in claim 1, wherein the subset of said conductive elements other than a particular conductive element includes, for each segment between and including the pair of reference segments, the portion of each conductive element occupying a position adjacent to that of the particular conductive element within that segment and the portion of each conductive element occupying a position adjacent to that of a conductive element occupying a position adjacent to the particular conductive element within that segment.

23. A conductive fabric as defined in claim 2, wherein said cross-over regions each include a plurality of printed circuit board layers and a plurality of conductive vias established through said layers.

24. A method for transmitting a plurality of signals in a conductive fabric including a plurality of conductive elements, comprising:
- a) guiding each signal through an alternating sequence of segments and cross-over regions;
  - i) within each of the segments, the conductive elements being arranged substantially in parallel, the segments including a pair of reference segments;
  - ii) within each of the cross-over regions located between two adjacent segments, the conductive elements being permuted so as to allow the position occupied by at least one of the conductive elements to be different in each of the two adjacent segments;
  - iii) between the pair of reference segments, each of the conductive elements experiencing coupling with respect to at least one of the conductive elements other than itself; and
  - iv) the coupling experienced by each of the conductive elements being substantially identical;
- wherein, for a particular one of the conductive elements, the subset of said conductive elements other than the particular one of the conductive elements includes, for each segment between and including the pair of reference segments, the portion of each conductive element occupying a position adjacent to that of the particular one of said conductive elements.

* * * * *

UNITED STATES PATENT AND TRADEMARK OFFICE
CERTIFICATE OF CORRECTION

PATENT NO. : 6,951,978 B1 Page 1 of 1
APPLICATION NO. : 10/739047
DATED : October 4, 2005
INVENTOR(S) : Richard S. Norman It is certified that error appears in the above-identified patent and that said Letters Patent is hereby corrected as shown below:

Column 5, line 56, should read --$12_1$-$12_{j-1}$, $12_{j+1}$-$12_N$-- instead of "$12_1$-$12_{j-1}$, $14_{j+1}$-$12_N$".

Claims: Claim 23 should be dependent on claim 1, not claim 2.

Signed and Sealed this

Seventeenth Day of October, 2006

JON W. DUDAS
*Director of the United States Patent and Trademark Office*